(12) United States Patent
Leobandung

(10) Patent No.: US 10,741,532 B2
(45) Date of Patent: Aug. 11, 2020

(54) MULTI-CHIP MODULES

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 15/918,537

(22) Filed: Mar. 12, 2018

(65) Prior Publication Data

US 2019/0279971 A1 Sep. 12, 2019

(51) Int. Cl.
| | |
|---|---|
| *H01L 25/065* | (2006.01) |
| *H01L 23/498* | (2006.01) |
| *H01L 25/16* | (2006.01) |
| *H01L 23/00* | (2006.01) |

(52) U.S. Cl.
CPC ............ *H01L 25/167* (2013.01); *H01L 24/09* (2013.01); *H01L 24/17* (2013.01); *H01L 24/32* (2013.01); *H01L 24/73* (2013.01); *H01L 24/92* (2013.01); *H01L 2224/0401* (2013.01); *H01L 2224/09177* (2013.01); *H01L 2224/16147* (2013.01); *H01L 2224/17104* (2013.01); *H01L 2224/17177* (2013.01); *H01L 2224/73203* (2013.01); *H01L 2224/73253* (2013.01); *H01L 2224/92125* (2013.01)

(58) Field of Classification Search
CPC .................................................... H01L 25/167
See application file for complete search history.

(56) References Cited

U.S. PATENT DOCUMENTS

| | | |
|---|---|---|
| 5,399,898 A | 3/1995 | Rostoker |
| 5,977,640 A | 11/1999 | Bertin et al. |
| 6,225,699 B1 | 5/2001 | Ference et al. |
| 6,768,208 B2 | 7/2004 | Lin et al. |
| 7,495,326 B2 | 2/2009 | Rinne |
| 8,866,308 B2 | 10/2014 | Roy et al. |
| 9,190,297 B2 | 11/2015 | Choi et al. |
| 9,418,966 B1 | 8/2016 | Kwon et al. |
| 2009/0002012 A1* | 1/2009 | Doong ............... G01R 31/2853 324/762.03 |
| 2010/0327424 A1 | 12/2010 | Braunisch et al. |
| 2011/0062576 A1* | 3/2011 | Slavov .............. H01L 23/49833 257/692 |

(Continued)

*Primary Examiner* — Julio J Maldonado
*Assistant Examiner* — Omar F Mojaddedi
(74) *Attorney, Agent, or Firm* — Vazken Alexanian; Ryan, Mason & Lewis, LLP

(57) ABSTRACT

A multi-chip module includes a first semiconductor component including a first set of connections having a first pitch dimension and at least a second set of connections having a second pitch dimension, wherein the first pitch dimension is smaller than the second pitch dimension. The multi-chip module further includes a second semiconductor component interconnected with the first set of connections of the first semiconductor component. The multi-chip module further includes at least a third semiconductor component interconnected with the second set of connections of the first semiconductor component and wherein a surface of the third semiconductor component is adhered to a surface of the second semiconductor component, wherein the surfaces at least partially overlap one another.

20 Claims, 2 Drawing Sheets

(56) References Cited

U.S. PATENT DOCUMENTS

| | | | |
|---|---|---|---|
| 2011/0285006 A1 | 11/2011 | Weng et al. | |
| 2015/0364454 A1* | 12/2015 | Zhai | H01L 25/18 257/693 |
| 2016/0133616 A1* | 5/2016 | Lopez | H01L 31/02008 257/290 |
| 2018/0286833 A1* | 10/2018 | Khalaf | H01L 23/49838 |

* cited by examiner

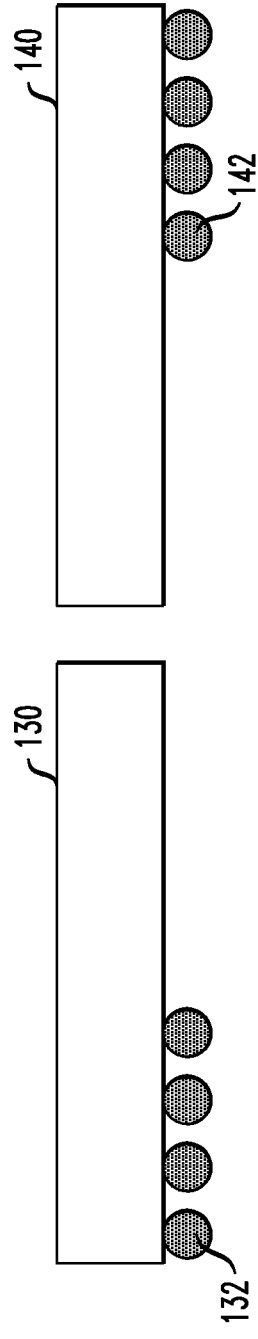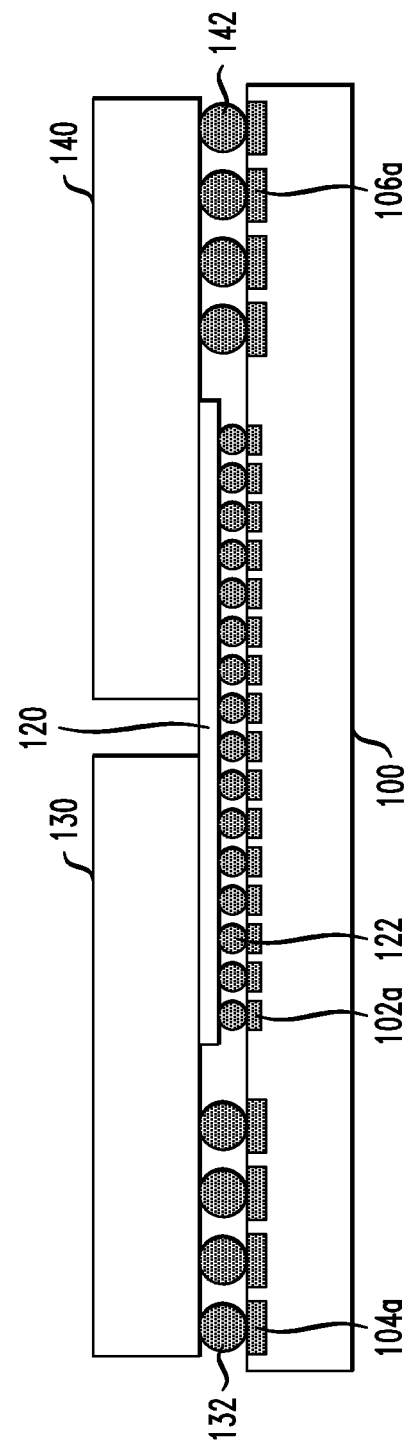

MULTI-CHIP MODULES

BACKGROUND

The present application generally relates to integrated circuits (chips), and more specifically, to stacking multiple chips in a multi-chip module.

Multi-chip modules (MCMs) combine several chips or dies in a common assembly. MCMs may offer significant advantages in system performance. For example, MCMs may consolidate many high-performance chips in a small form factor with shorter interconnects that run at higher speeds than standard monolithic single chip modules (SCMs). MCMs offer higher interconnect density and greater bandwidth than typical SCMs and printed circuit boards will allow. MCMs may also facilitate more cost-effective thermal management. For example, MCMs consolidate thermal dissipation requirements in a single location and then employ a highly efficient cooling solution (such as, e.g., a cold plate and/or water cooling) that may not be economically feasible with SCMs dispersed on a system motherboard or system planar.

SUMMARY

Illustrative embodiments provide improved methods of fabricating multi-chip modules (MCMs).

In one exemplary embodiment, a method for fabricating a multi-chip module comprise the following steps. The method comprises forming a first semiconductor component comprising a first set of connections having a first pitch dimension and at least a second set of connections having a second pitch dimension, wherein the first pitch dimension is smaller than the second pitch dimension. The method comprises forming a second semiconductor component comprising a third set of connections having a third pitch dimension, wherein the first pitch dimension is approximately equal to the third pitch dimension. The method comprises forming at least a third semiconductor component comprising a fourth set of connections having a fourth pitch dimension, wherein the second pitch dimension is approximately equal to the fourth pitch dimension. The method comprises interconnecting the second semiconductor component with the first semiconductor component by connecting the third set of connection of the second semiconductor component with the first set of connections of the first semiconductor component. The method comprises interconnecting the third semiconductor component with the first semiconductor component by connecting the fourth set of connections of the third semiconductor component with the second set of connections of the first semiconductor component. The method comprises adhering a surface of the third semiconductor component to a surface of the second semiconductor component, wherein the surfaces at least partially overlap one another.

Another exemplary embodiment comprises a multi-chip module (MCM). For example, the MCM comprises a first semiconductor component comprising a first set of connections having a first pitch dimension and at least a second set of connections having a second pitch dimension, wherein the first pitch dimension is smaller than the second pitch dimension. The MCM further comprises a second semiconductor component comprising a third set of connections having a third pitch dimension, wherein the first pitch dimension is approximately equal to the third pitch dimension. The MCM further comprises at least a third semiconductor component comprising a fourth set of connections having a fourth pitch dimension, wherein the second pitch dimension is approximately equal to the fourth pitch dimension. The MCM further comprises the second semiconductor component being interconnected with the first semiconductor component by connection of the third set of connection of the second semiconductor component with the first set of connections of the first semiconductor component. The MCM further comprises the third semiconductor component being interconnected with the first semiconductor component by connection of the fourth set of connections of the third semiconductor component with the second set of connections of the first semiconductor component. The MCM further comprises a surface of the third semiconductor component being adhered to a surface of the second semiconductor component, wherein the surfaces at least partially overlap one another.

Yet another exemplary embodiment comprises a system comprising a multi-chip module (MCM). The MCM comprises a first semiconductor component comprising a first set of connections having a first pitch dimension and at least a second set of connections having a second pitch dimension, wherein the first pitch dimension is smaller than the second pitch dimension. The MCM further comprises a second semiconductor component comprising a third set of connections having a third pitch dimension, wherein the first pitch dimension is approximately equal to the third pitch dimension. The MCM further comprises at least a third semiconductor component comprising a fourth set of connections having a fourth pitch dimension, wherein the second pitch dimension is approximately equal to the fourth pitch dimension. The MCM further comprises the second semiconductor component being interconnected with the first semiconductor component by connection of the third set of connection of the second semiconductor component with the first set of connections of the first semiconductor component. The MCM further comprises the third semiconductor component being interconnected with the first semiconductor component by connection of the fourth set of connections of the third semiconductor component with the second set of connections of the first semiconductor component. The stacked MCM further comprises a surface of the third semiconductor component being adhered to a surface of the second semiconductor component, wherein the surfaces at least partially overlap one another.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 3 illustrates a third and fourth semiconductor component at a third and fourth fabrication stage, according to an illustrative embodiment.

FIG. 4 illustrates the fabrication of the semiconductor components of FIGS. 1-3 to form a stacked MCM, according to an illustrative embodiment.

DETAILED DESCRIPTION

Figure 1:
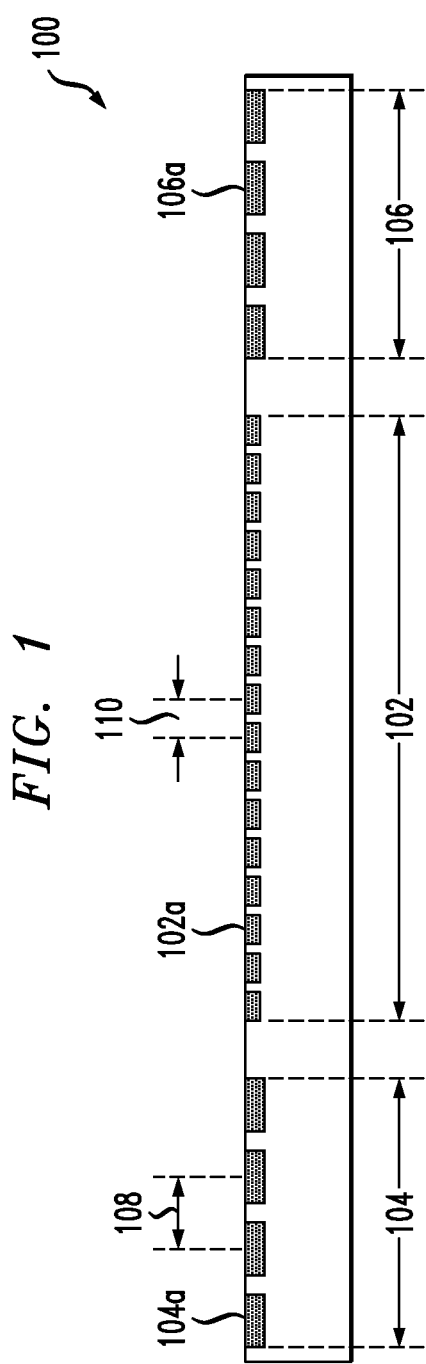
FIG. 1 illustrates a first semiconductor component at a first fabrication stage, according to an illustrative embodiment.

In illustrative embodiments, techniques are provided for forming a stacked MCM, using different sized chip connections. As will be explained in illustrative embodiments, such fabrication techniques advantageously improve the fabrication of a stacked MCM by utilizing solder bump and pad connections rather than utilizing through silicon vias (TSVs), substrate wires, or the like.

Furthermore, it is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional IC device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. In addition, in the figures, the illustrated scale of one layer, structure, and/or region relative to another layer, structure, and/or region is not necessarily intended to represent actual scale.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

As used herein, the term "semiconductor component" refers to any substrate, die, wafer, or chip that may be used in forming an MCM. For example, a substrate may be a ceramic or organic substrate, and a chip may be a processing device, application-specific logic, a memory device, a photovoltaic cell, a laser, a radio frequency (RF) antenna, or an input/output (I/O) chip. However, one skilled in the art will readily understand that alternative examples of substrates and chips can be used herein.

There is a current need for the development of processes to manufacture both low cost and high volume ultra-small die package assemblies. These package assemblies can be used for applications where miniaturization of electronic devices is desired such as for, by way of example only, mobile devices, Internet of Things (IOT) devices, wearable devices, smart phones, bio-compatible interface low power devices, light weight electronic systems, and the like.

In three-dimensional (3D) chip stacks, chips or dies are layered on top of one another in a 3D stack with electrical interconnects between the layers. This configuration has many benefits, such as providing a designer with the ability to place an increased number of chips in a given two-dimensional (2D) area with an increased amount of electrical communication connections between them. In two and half dimensional (2.5D) packages, an interconnect substrate known as an interposer is used to provide high density interconnects. The interposer is placed between the substrate and the dies, where the interposer contains TSVs connecting the metallization layers on its upper and lower surfaces. However, these methods are expensive.

Illustrative embodiments provide MCM manufacturing techniques that overcome the above and other challenges by utilizing solder bump and pad connections rather than TSVs or substrate wires.

Figure 2:
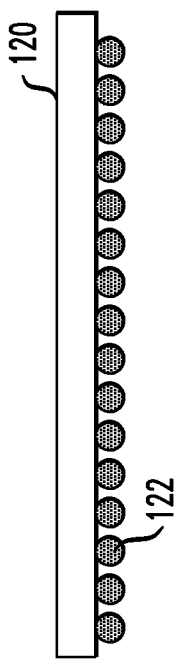
FIG. 2 illustrates a second semiconductor component at a second fabrication stage, according to an illustrative embodiment.

An illustrative embodiment for stacking multiple IC (chips) in a stacked MCM will be described below with reference to FIGS. 1-4. FIGS. 1-3 illustrate a first semiconductor component 100, a second semiconductor component 120, a third semiconductor component 130 and a fourth semiconductor component 140, for forming the stacked MCM according to one or more illustrative embodiments. As one skilled in the art will understand, the MCM can comprise three semiconductor components or more than three semiconductor components.

FIG. 1 illustrates first semiconductor component 100. In one embodiment, first semiconductor component 100 may be any ceramic or organic substrate that carries or otherwise structurally or functionally supports other semiconductor components (e.g., chips) as is well known in the art. Ceramic substrates include, for example, silicon oxides and silicates such as aluminum silicate, and aluminum oxides. The organic substrates include, for example, thermoplastic and/or thermosetting resins. Many of such substrates contain the resin and a reinforcing material such as fiberglass. Suitable thermosetting resins include, for example, FR-4 epoxy resins, phenolic based materials, bismaleimide-triazine resins and polyimides. Suitable thermoplastic polymers include, for example, polyolefins such as polypropylene, polysulfones, fluorocarbon polymers, polyethylene terephthalate, polycarbonates, nitrile rubbers and acrylonitrile butadiene styrene polymers.

In one embodiment, first semiconductor component 100 can be a first chip such as, for example, a processor such as System-on-Chip (SOC), Central Processing Unit (CPU), Digital Signal Processor (DSP), Graphics Processing Unit (GPU), Advanced Processing Unit (APU), or other type of processor. In one embodiment, first semiconductor component 100 may be, for example, an application-specific integrated circuit (ASICs) or logic.

First semiconductor component 100 has a center connection region 102 and outer connection regions 104 and 106 with each connection region having a set of connections, with a pitch dimension, for interconnecting the semiconductor component. Those skilled in the art will recognize that the set of connections will allow for electrical connections to upper chips in the stacked MCM. In one embodiment, the set of connections can be a controlled collapsed chip (C4) connection, i.e., C4 pads. C4 connection techniques include methods for electrically interconnecting semiconductor components with solder bumps (connection bumps, herein) that are deposited onto the chip pads (connection pads, herein). However, one skilled in the art will understand that any suitable chip connection can be used herein. In one embodiment, center connection region 102 has a set of connections 102a to connect to second semiconductor component 120 as discussed below.

The first set of connections 102a have a pitch dimension 110 which is lower than the pitch dimension 108 of the set of connections 104a and optional set of connections 106a. In one embodiment, the set of connections 102a have a pitch dimension of from about 30 micrometers (μm) to about 90 μm. In one embodiment, outer connection regions 104 and 106 have a set of connections 104a and optional set of connections 106a to connect to third semiconductor component 130 and optional fourth semiconductor component 140 as discussed below. In one embodiment, each set of connections 104a and optional set of connections 106a will have a pitch dimension of from about 95 µm to about 200 µm. In one embodiment, the set of connections 104a have the same pitch dimension as the optional set of connections 106a. In another embodiment, the set of connections 104a will have a different bump dimension as the optional set of connections 106a.

First semiconductor component 100 may be formed using any suitable substrate or chip formation process known in the art. The first semiconductor component 100 may also be planarized using any suitable polishing or grinding technique known in the art.

FIG. 2 illustrates second semiconductor component 120. In one embodiment, second semiconductor component 120 may be, for example, a memory chip or some other type of chip having a set of connections 122 in the form of a plurality of solder bumps. The set of connections 122 has a small pitch dimension to allow a high number of connections in a small area. In addition, the pitch dimension of the plurality of C4 bumps 122 is sized to match the corresponding pad pitch of the plurality of pads 102a in center connection region 102 of first semiconductor component 100, i.e., the pitch dimension of the set of connections 122 is about or substantially equal to the corresponding pitch dimension of the set of connections 102a. In one example, the pitch dimension of set of connections 122 is from about 30 µm to about 90 µm. In one example, second semiconductor component 120 is a memory chip having a connection region to contain power connections for the chip.

Second semiconductor component 120 may be formed using any suitable substrate or chip formation process known in the art. The second semiconductor component 120 may also be planarized using any suitable polishing or grinding technique known in the art, such as, for example, CMP resulting in a coplanar top surface. In general, second semiconductor component 120 may have a thickness from about 20 µm to about 200 µm or from about 30 µm to about 80 µm.

FIG. 3 also illustrates third semiconductor component 130 and optional fourth semiconductor component 140. In one embodiment, third semiconductor component 130 may be, for example, a photovoltaic cell or a laser. Third semiconductor component 130 has a set of connections 132 on at least a portion of a surface of third semiconductor component 130. In one embodiment, third semiconductor component 130 has a set of connections 132 (C4 bumps) on at least a portion of an outer region of third semiconductor component 130 in order to connect with either the set of connections 104a or optional set of connections 106a in outer connection regions 104 and 106, respectively, of first semiconductor component 100. The set of connections 132 also has a larger pitch dimension to allow a small number of connections in a small area. In addition, the pitch dimension of the set of connections 132 is sized to match the corresponding pitch dimension of either the set of connections 104a or 106a in outer connection regions 104 and 106, respectively, of first semiconductor component 100, i.e., the pitch dimension of the set of connections 132 is about or substantially equal to the corresponding pitch dimension of the plurality of pads 104a or optional pads 106a. In one example, the pitch dimension of plurality of pads 132 is from about 95 µm to about 200 µm.

Third semiconductor component 130 may be formed using any suitable substrate or chip formation process known in the art. The third semiconductor component 130 may also be planarized using any suitable polishing or grinding technique known in the art, such as, for example, CMP resulting in a coplanar top surface. In general, third semiconductor component 130 may have a thickness from about 50 µm to about 1000 µm or from about 100 µm to about 500 µm.

FIG. 3 also illustrates fourth semiconductor component 140. In one embodiment, fourth semiconductor component 140 may be, for example, a radio frequency antenna or an input/output (I/O) chip. Fourth semiconductor component 140 has a set of connections 142 on at least a portion of a surface of fourth semiconductor component 140. In one embodiment, fourth semiconductor component 140 has a set of connections 142 (C4 bumps) on at least a portion of an outer region of fourth semiconductor component 140 in order to connect with either the set of connections 104a or optional set of connections 106a in outer connection regions 104 and 106, respectively, of first semiconductor component 100. The set of connections 142 also has a larger pitch dimension to allow a small number of connections in a small area. In addition, the pitch dimension of the set of connections 142 is sized to match the corresponding pitch dimension of either the set of connections 104a or optional set of connections 106a in outer connection regions 104 and 106, respectively, of first semiconductor component 100, i.e., the pitch dimension of the set of connections 142 is about or substantially equal to the corresponding pitch dimension of the set of connections 104a or optional set of connections 106a. In one example, the pitch dimension of set of connections 142 is from about 95 µm to about 200 µm.

Fourth semiconductor component 140 may be formed using any substrate or chip formation process known in the art. The fourth semiconductor component 140 may also be planarized using any polishing or grinding technique known in the art, such as, for example, CMP resulting in a coplanar top surface. In general, fourth semiconductor component 140 may have a thickness from about 50 µm to about 1000 µm or from about 100 µm to about 500 µm.

One embodiment to form a stacked multi-chip module is illustrated in FIG. 4. First, the set of connections 122 of second semiconductor component 120 are connected to the set of connections 102a of first semiconductor component 100. As discussed above, the pitch dimension of the set of connections 122 of second semiconductor component 120 are sized to match the corresponding set of connections 102a of first semiconductor component 100. Accordingly, the set of connections 122 of second semiconductor component 120 are connected to the corresponding set of connections 102a of first semiconductor component 100 by C4 connection techniques well known in the art. In one embodiment, as mentioned, first semiconductor component 100 and second semiconductor component 120 can be connected using solder bumps. For example, C4 processes are well known in forming solder bumps in IC fabrication. During assembly, solder bumps establish physical attachment and electrical contact between the set of connections on the first semiconductor component 100 and the corresponding set of connections on the second semiconductor component 120. For example, the set of connections 122 of second semiconductor component 120 are disposed on the corresponding set of connections 102a of first semiconductor component 100, heat is applied to reflow the solder, and the solder is solidified to connect the set of connections on the first semiconductor component 100 with the corresponding set of connections on the second semiconductor component 120.

Next, the set of connections 104a and optional set of connections 106a in outer regions 104 and 106, respectively, of first semiconductor component 100 are connected to set of connections 132 of third semiconductor component 130 and optionally the set of connections 142 of fourth semiconductor component 140. As discussed above, the pitch dimension of the set of connections 104a and optional set of connections 106a of first semiconductor component 100 are sized to match the corresponding set of connections 132 of third semiconductor component 130 and optional set of connections 142 of fourth semiconductor component 140. Accordingly, the set of connections 104a and optional set of connections 106a in outer regions 104 and 106, respectively, of first semiconductor component 100 are connected to the respective corresponding set of connections 132 of third semiconductor component 130 and optional set of connections 142 of fourth semiconductor component 140 by techniques well known in the art as discussed above.

Second semiconductor component 120 is operatively connected to third semiconductor component 130 and optional fourth semiconductor component 140, wherein the surfaces at least partially overlap one another. For example, a surface of the second semiconductor component 120 can be adhered to a surface of the third semiconductor component 130 and a surface of the optional fourth semiconductor component 140 with, for example, a glue such as a dielectric glue, tape, Velcro, or the like.

In one embodiment, the assembly of the stacked MCM is carried out in the absence of TSVs or substrate wires.

It is to be further understood that the methods discussed herein for fabricating semiconductor structures can be incorporated within semiconductor processing flows for fabricating other types of semiconductor devices and IC with various analog and digital circuitry or mixed-signal circuitry. In particular, IC (chip) can be fabricated with various devices such as transistors, diodes, capacitors, inductors, etc. An IC in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such IC are considered part of the embodiments described herein.

Furthermore, various layers, regions, and/or structures described above may be implemented in IC (chips). The resulting stacked IC chips can be further integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for fabricating a multi-chip module comprising:
    forming a first semiconductor component comprising a first set of connections having a first pitch dimension and at least a second set of connections having a second pitch dimension, wherein the first pitch dimension is smaller than the second pitch dimension;
    forming a second semiconductor component comprising a third set of connections having a third pitch dimension, wherein the first pitch dimension is approximately equal to the third pitch dimension;
    forming at least a third semiconductor component comprising a fourth set of connections having a fourth pitch dimension, wherein the second pitch dimension is approximately equal to the fourth pitch dimension;
    interconnecting the second semiconductor component with the first semiconductor component by connecting the third set of connection of the second semiconductor component with the first set of connections of the first semiconductor component;
    interconnecting the third semiconductor component with the first semiconductor component by connecting the fourth set of connections of the third semiconductor component with the second set of connections of the first semiconductor component; and
    adhering a surface of the third semiconductor component to a surface of the second semiconductor component, wherein the surfaces at least partially overlap one another.

2. The method of claim 1, wherein the first semiconductor component further comprises a fifth set of connections having a fifth pitch dimension, wherein the fifth pitch dimension is approximately equal to the second pitch dimension.

3. The method of claim 2, further comprising:
    forming a fourth semiconductor component comprising a sixth set of connections having a sixth pitch dimension, wherein the sixth pitch dimension is approximately equal to the fifth pitch dimension;
    interconnecting the fourth semiconductor component with the first semiconductor component by connecting the sixth set of connection of the fourth semiconductor component with the fifth set of connections of the first semiconductor component; and
    adhering a surface of the fourth semiconductor component to a surface of the second semiconductor component, wherein the surfaces at least partially overlap one another.

4. The method of claim 3, wherein the fourth semiconductor component comprises at least one of an antenna device and an input/output device.

5. The method of claim 1, wherein the first semiconductor component comprises a semiconductor substrate.

6. The method of claim 1, wherein the first semiconductor component comprises at least one of a processing device and application-specific logic.

7. The method of claim 1, wherein the second semiconductor component comprises a memory device.

8. The method of claim 1, wherein the third semiconductor component comprises at least one of a photovoltaic cell and a laser.

9. The method of claim 1, wherein the step of adhering the surface of the third semiconductor component to the surface of the second semiconductor component comprises gluing the surface of the second semiconductor component to the surface of the third semiconductor component with a dielectric glue.

10. The method claim 1, wherein the set of connections are controlled collapsed chip connections.

11. The method of claim 1, which is carried out in the absence of through substrate via or substrate wires.

12. A method for fabricating a multi-chip module comprising:
- forming a first semiconductor component comprising a center connection region having a first set of connections with a first pitch dimension and outer connection regions having a second set of connections with a second pitch dimension, wherein the pitch dimension of the first set of connections is smaller than the pitch dimension of the second set of connections;
- forming a second semiconductor component comprising a third set of connections having a third pitch dimension, wherein the first pitch dimension is approximately equal to the third pitch dimension;
- forming a third semiconductor component comprising a fourth set of connections having a fourth pitch dimension, wherein the second pitch dimension is approximately equal to the fourth pitch dimension;
- forming a fourth semiconductor component comprising a fifth set of connections having a fifth pitch dimension, wherein the second pitch dimension is approximately equal to the fifth pitch dimension;
- interconnecting the second semiconductor component with the first semiconductor component by connecting the third set of connection of the second semiconductor component with the first set of connections of the first semiconductor component;
- interconnecting the third semiconductor component with the first semiconductor component by connecting the fourth set of connections of the third semiconductor component with the second set of connections of the first semiconductor component on the outer region;
- interconnecting the fourth semiconductor component with the first semiconductor component by connecting the fifth set of connections of the third semiconductor component with the second set of connections of the first semiconductor component on the other outer region; and
- adhering a surface of the third semiconductor component and the fourth semiconductor component to a surface of the second semiconductor component, wherein the surfaces at least partially overlap one another.

13. The method of claim 12, wherein the first set of connections and each of the second set of connections comprises connection pads.

14. The method of claim 12, wherein the pitch dimension of the first set of connections is about 30 micrometers (μm) to about 90 μm, and the pitch dimension of the second set of connections is about 95 μm to about 200 μm.

15. The method of claim 12, wherein the third set of connections of the second semiconductor component is in the form of a plurality of solder bumps, and further wherein the pitch dimension of the plurality of solder bumps is sized to be substantially equal to the corresponding pitch dimension of the first set of connections.

16. The method of claim 12, wherein the fourth set of connections of the third semiconductor component is in the form of a plurality of solder bumps, and further wherein the pitch dimension of the plurality of solder bumps is sized to be substantially equal to the corresponding pitch dimension of the second set of connections of one outer region, and the fifth set of connections of the fourth semiconductor component is in the form of a plurality of solder bumps, and further wherein the pitch dimension of the plurality of solder bumps is sized to be substantially equal to the corresponding pitch dimension of the second set of connections of the other outer region.

17. The method of claim 15, wherein the fourth set of connections of the third semiconductor component is in the form of a plurality of solder bumps, and further wherein the pitch dimension of the plurality of solder bumps is sized to be substantially equal to the corresponding pitch dimension of the second set of connections of one outer region, and the fifth set of connections of the fourth semiconductor component is in the form of a plurality of solder bumps, and further wherein the pitch dimension of the plurality of solder bumps is sized to be substantially equal to the corresponding pitch dimension of the second set of connections of the other outer region.

18. The method of claim 12, wherein the third semiconductor component and the fourth semiconductor component each have a thickness from about 50 μm to about 1000 μm.

19. The method of claim 12, wherein the first semiconductor component comprises at least one of a processing device and application-specific logic, the second semiconductor component comprises a memory device, the third semiconductor component comprises at least one of a photovoltaic cell and a laser, and the fourth semiconductor component comprises at least one of an antenna device and an input/output device.

20. The method of claim 17, wherein the first semiconductor component comprises at least one of a processing device and application-specific logic, the second semiconductor component comprises a memory device, the third semiconductor component comprises at least one of a photovoltaic cell and a laser, and the fourth semiconductor component comprises at least one of an antenna device and an input/output device.

* * * * *